(12) United States Patent
Tamura et al.

(10) Patent No.: US 9,784,438 B2
(45) Date of Patent: Oct. 10, 2017

(54) CONNECTED BODY OF A PLURALITY OF LIGHT EMITTING DEVICES

(71) Applicant: NICHIA CORPORATION, Anan-shi, Tokushima (JP)

(72) Inventors: Takeshi Tamura, Anan (JP); Tomonori Ozaki, Anan (JP); Yasuo Fujikawa, Tokushima (JP)

(73) Assignee: Nichia Corporation, Anan-shi (JP)

( * ) Notice: Subject to any disclaimer, the term of this patent is extended or adjusted under 35 U.S.C. 154(b) by 36 days.

(21) Appl. No.: 14/431,448

(22) PCT Filed: Sep. 18, 2013

(86) PCT No.: PCT/JP2013/075126
§ 371 (c)(1),
(2) Date: Mar. 26, 2015

(87) PCT Pub. No.: WO2014/050655
PCT Pub. Date: Apr. 3, 2014

(65) Prior Publication Data
US 2015/0338069 A1    Nov. 26, 2015

(30) Foreign Application Priority Data

Sep. 28, 2012 (JP) ................................. 2012-216945

(51) Int. Cl.
*F21S 4/00* (2016.01)
*F21V 21/005* (2006.01)
(Continued)

(52) U.S. Cl.
CPC .............. *F21V 21/005* (2013.01); *F21S 4/20* (2016.01); *F21S 4/22* (2016.01); *F21V 23/005* (2013.01);
(Continued)

(58) Field of Classification Search
CPC ..... F21S 4/005; F21S 4/003; F21Y 2103/003; F21V 23/06; H05K 1/189
(Continued)

(56) References Cited

U.S. PATENT DOCUMENTS

| 2008/0101070 A1 | 5/2008 | Chou |
| 2011/0013379 A1 | 1/2011 | Matsukura |
| 2012/0293729 A1 | 11/2012 | Yoshikawa |

FOREIGN PATENT DOCUMENTS

| JP | 02-90265 U | 7/1990 |
| JP | 2006-295143 A | 10/2006 |

(Continued)

*Primary Examiner* — Andrew Coughlin
*Assistant Examiner* — Meghan Ulanday
(74) *Attorney, Agent, or Firm* — Global IP Counselors, LLP

(57) ABSTRACT

A connected body includes first and second light emitting devices and a connecting member. The first light emitting device includes a flexible first substrate member extending in a predetermined direction, a first light emitting element arranged on the first substrate member, and an electronic component arranged on a first end portion of the first substrate member with respect to the predetermined direction. The second light emitting device includes a flexible second substrate member extending in the predetermined direction, and a second light emitting element arranged on the second substrate member. The connecting member connecting the first end portion of the first substrate member and a second end portion of the second substrate member adjacent to the first end portion of the first substrate. A position of at least a part of the connecting member in the predetermined direction overlaps a position of the electronic component in the predetermined direction.

9 Claims, 11 Drawing Sheets

(51) Int. Cl.
  *F21V 23/00*   (2015.01)
  *F21V 23/06*   (2006.01)
  *F21S 4/20*    (2016.01)
  *F21S 4/22*    (2016.01)
  *F21Y 103/10*  (2016.01)
  *F21Y 115/10*  (2016.01)

(52) U.S. Cl.
  CPC ........... *F21V 23/06* (2013.01); *F21Y 2103/10* (2016.08); *F21Y 2115/10* (2016.08); *H01L 2224/73204* (2013.01)

(58) Field of Classification Search
  USPC .......................... 362/249.01, 249.02, 249.04
  See application file for complete search history.

(56) References Cited

FOREIGN PATENT DOCUMENTS

| | | |
|---|---|---|
| JP | 2007-335866 A | 12/2007 |
| JP | 2009-152636 A | 7/2009 |
| JP | 2010-153549 A | 7/2010 |
| JP | 2011-040373 A | 2/2011 |
| JP | 2012-009220 A | 1/2012 |
| JP | 2012-048964 A | 3/2012 |
| JP | 2012-160426 A | 8/2012 |
| WO | 2011-096246 A1 | 8/2011 | ary of a plurality of
CONNECTED BODY OF A PLURALITY OF LIGHT EMITTING DEVICES

CROSS-REFERENCE TO RELATED APPLICATIONS

This is application claims priority to Japanese Patent Application No. 2012-216945 filed on Sep. 28, 2012. The entire disclosure of Japanese Patent Application No. 2012-216945 is hereby incorporated herein by reference.

TECHNICAL FIELD

The present invention relates to a connected body of a plurality of light emitting devices.

BACKGROUND ART

For the purpose of easy packing of a plurality of flexible wiring boards, a technique of sequentially interposing a plurality of flexible wiring boards between two weakly-adhesive films has been proposed (see JP H02-90265U).

DISCLOSURE OF INVENTION

However, by the technique described in the above mentioned publication, all of the flexible wiring boards are enveloped in two films. This may result in not only an increase in the material cost but also complicated unpacking. Also, in the technique described in the above mentioned publication, no consideration is given to the products such as a light emitting device equipped with the electronic components (such as a connector and a diode) arranged on the flexible wiring boards. Thus, a new proposal on packaging of such products has been expected.

The present invention is devised in the light of such circumstances, and it is hence an object thereof to provide a connected body of a plurality of light emitting devices which allows easy packing.

A connected body of a plurality of light emitting devices according to the present invention may include a first light emitting device, a second light emitting device, and a connecting member. The first light emitting device may include a flexible first substrate member extending in a predetermined direction, a first light emitting element arranged on the first substrate member, and an electronic component arranged on a first end portion of the first substrate member in the predetermined direction. The second light emitting device may include a flexible second substrate member extending in a predetermined direction and a second light emitting element arranged on the second substrate member. The connecting member connects the first end portion of the first substrate member and a second end portion of the second substrate member which is adjacent to the first end portion. The position of at least a part of the connecting member in the predetermined direction overlaps the position of the electronic component in the predetermined direction.

According to the present invention, a connected body of a plurality of light emitting devices which allows easy packaging can be provided.

DETAILED DESCRIPTION OF THE INVENTION

Next, embodiments of the invention will be described with reference to the drawings. In the description of the drawings below, the same or similar components are denoted by the same or similar reference symbols. However, it should be noted that the drawings are drawn schematically, and the dimensional ratios and the like of the components may differ from the actual ratios. Accordingly, the specific dimension and the like should be determined in consideration of the description below. In addition, it is needless to say that the drawings may also include the components that have different dimensional relations and ratios among one another.

First Embodiment

Configuration of Base Member 1

Figure 1:
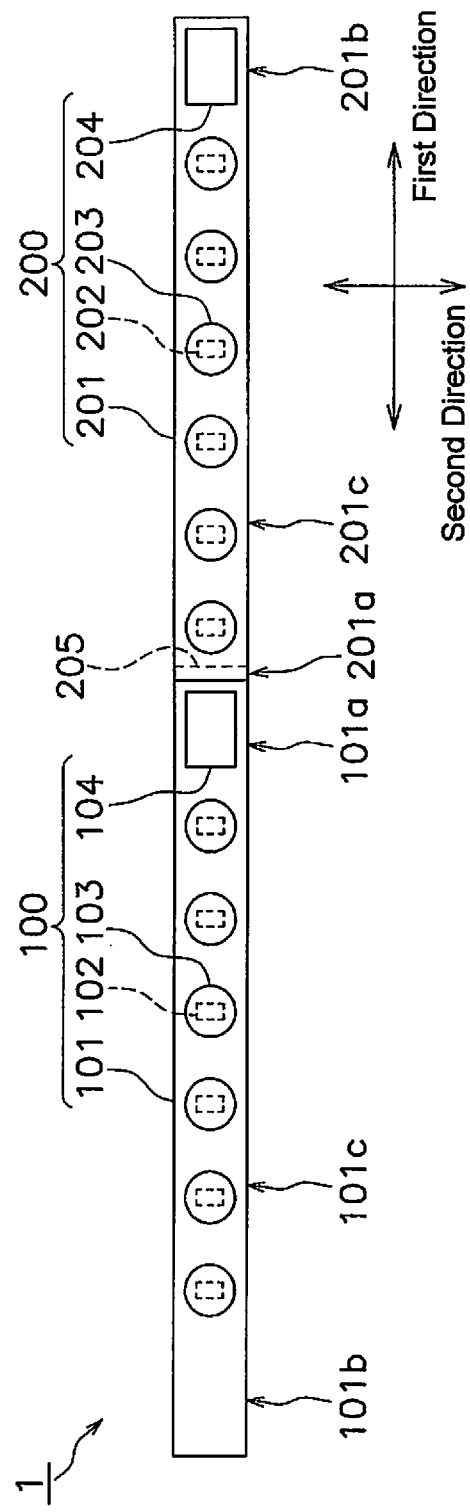
FIG. 1 is a top view showing a configuration of a connected body according to a first embodiment.
Figure 2:
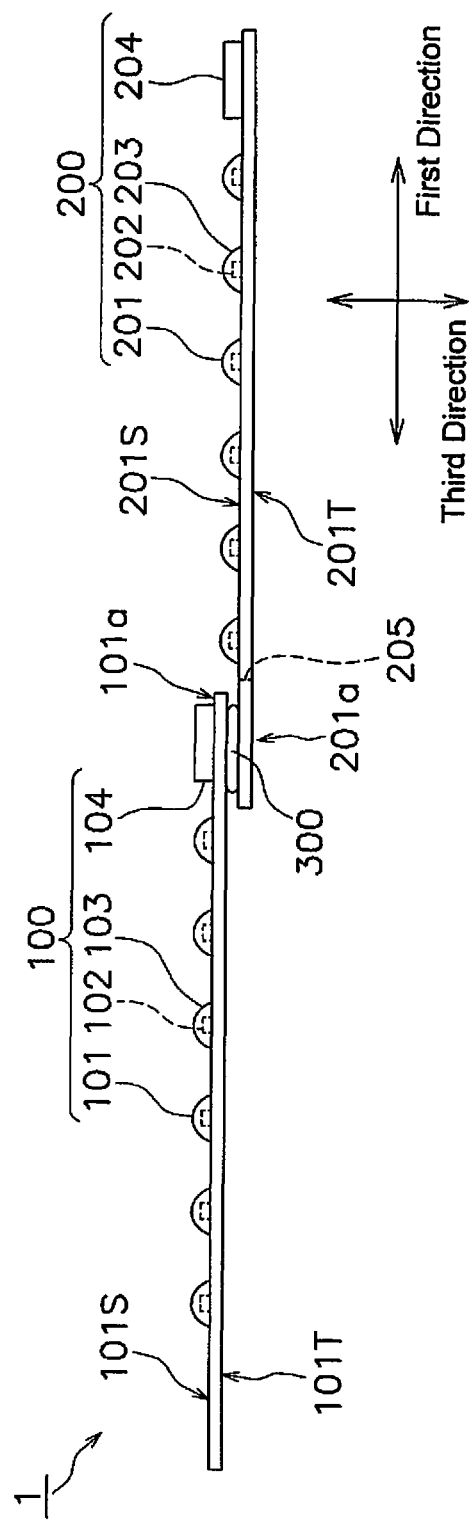
FIG. 2 is a side view showing a configuration of a connected body according to the first embodiment.

FIG. 1 is a top view showing a configuration of a connected body 1. FIG. 2 is a side view showing a configuration of the connected body 1. The connected body 1 can be transported and stored in a state of being wound on a spool. In the description below, the terms "first direction" refers to the winding direction of the connected body 1, "second direction" refers to a direction which is perpendicular to the first direction in a top view, and "third direction" refers to a direction which is perpendicular to the first direction and the second direction. In the present embodiment, the first direction is an example of a predetermined direction and is in the long-side direction of the connected body 1. The second direction is aligned with the short-side direction of the connected body 1.

A connected body 1 includes a first light emitting device 100, a second light emitting device 200, and a connecting member 300. The connected body 1 is constituted by connecting the first light emitting device 100 and the second light emitting device 200 by the connecting member 300.

1. Configuration of First Light Emitting Device 100

The first light emitting device 100 includes a first base member 101, a plurality of first light emitting elements 102, a plurality of first sealing resin members 103, and a first connector 104 (an example of an electronic component).

The first base member 101 is an elongated member extending in the first direction. The first base member 101 includes a first connecting end portion 101a (an example of a first end portion), a first free-end portion 101b, and a first intermediate portion 101c. The first connecting end portion 101a is connected to the second light emitting device 200 via the connecting member 300. On the first end portion 101a, a first connector 104 is arranged. The first free end portion 101b is provided at the opposite side to the first connecting end portion 101a. The first free end portion 101b is not connected to the connecting member 300, and the first light emitting element 102 is not arranged on the first free end portion 101b. The first intermediate portion 101c is arranged between a first connected end portion 101a and the first free end portion 101b. The first intermediate portion 101c is not connected to the connecting member 300 and the plurality of first light emitting elements 102 are arranged on the first intermediate portion 101c.

The ratio of the size of the first base member 101 in the first direction to that in the second direction can be set appropriately, and for example, a ratio of 6:1, 30:1, or 100:1 can be employed. More specifically, the length of the first base member 101 in the first direction can be, for example, 1150 mm, and the width of the first base member 101 in the second direction can be, for example 15 mm. Also, the thickness of the first base member 101 in the third direction can be, for example, 20 μm to 800 μm. The configuration of the first base member 101 will be described below.

The plurality of first light emitting elements 102 are arranged on the first upper surface 101S (see FIG. 2) of the first base member 101. More specifically, the plurality of first light emitting elements 102 are arranged in a line along the first direction on a first intermediate portion 101c of the first base member 101. Also, each of the plurality of first light emitting elements 102 is electrically connected to the first connector 104 via the first base member 101. Each first light emitting element 102 emits light when supplied with power from an external power source which is connected to the first connector 104. The configuration of the first light emitting element 102 will be described below.

The plurality of first sealing resin members 103 are respectively arranged on the first upper surface 101S (see FIG. 2) of the first substrate body 101. The plurality of first sealing resin members 103 respectively seal the plurality of first light emitting elements 102. Therefore, the plurality of sealing resin members 103 are arranged in a line along the first direction on the intermediate portion 101c of the base member 101. In the present embodiment, each of the first sealing resin members 103 is formed in a hemisphere shape centered at corresponding one of the light emitting elements 30.

The first sealing resin members 103 are formed with a light transmissive resin (for example, an epoxy resin, a urea resin, a silicone resin, or the like). The first sealing resin members 103 may contain a light scattering material (barium sulfate, titanium oxide, aluminum oxide, silicon oxide, etc.). Also, the first sealing resin members 103 preferably contain a wavelength converting member such as a fluorescent material to absorb light emitted from the first light emitting elements 102 and emits light of different wavelength. Examples of such a wavelength converting member include an oxide-based fluorescent material, a sulfide-based fluorescent material, and a nitride-based fluorescent material. In the case where a gallium nitride-based light emitting element to emit blue light is used as the first light emitting element 102, a fluorescent material to absorb blue light, such as a YAG-based fluorescent material or a LAG-based fluorescent material to emit yellow to green light, a SiAlON-based fluorescent material to emit green light, and a SCASN-based fluorescent material and a CASN-based fluorescent material to emit red light, are preferably used singly or in combination. More specifically, in the case where the first light emitting device 100 is used for a display device such as a backlight for liquid crystal display, TV-screen, or the like, a SiAlON-based fluorescent material and a SCASN-based fluorescent material are preferably used in combination. Also, in the case where the first light emitting device 100 is used for lighting applications, it is preferable to use a YAG-based fluorescent material or a LAG-based fluorescent material in combination with a SCASN-based fluorescent material or a CASN-based fluorescent material. Moreover, a wavelength converting member may be disposed on the surface of the first light emitting element 102, and a first sealing resin 103 which does not contain a wavelength converting member may be further applied thereon to cover the wavelength converting member. For the method of forming the first sealing resin members 103, potting, transfer molding, screen printing, or the like, can be used, but it is not limited to those methods.

The first connector 104 is arranged on the first connecting end portion 101a of the first base member 101. In the present embodiment, the first connector 104 is arranged at the opposite side of the connecting member 300 with the first base member 101 in between. The first connector 104 is electrically connected to the plurality of first light emitting elements 102 via the first base member 101. The first connector 104 can be connected to an external power source and configured to supply electric power from the external power source to a plurality of first light emitting elements 102.

2. Configuration of Second Light Emitting Device 200

The second light emitting device 200 includes a second base member 201, a plurality of second light emitting elements 202, a plurality of second sealing resin members 203, and a second connector 204.

The second base member 201 is an elongated member extending in the first direction. The second base member 201 includes a second connecting end portion 201a (an example of a second end portion), a second free end portion 201b, and a second intermediate portion 201c. The second connecting end portion 201a is connected to the first light emitting device 100 via the connecting member 300. In the connected body 1 according to the present embodiment, the first connecting end portion 101a of the first base member 101 and the second connecting end portion 201a of the second base member 201 are overlapped. The position of the first connecting end portion 101a in the first direction overlaps the position of the second connecting end portion 201 in the first direction. The configurations of the second free end portion 201b and the second intermediate portion 201c are similar to the configurations of the first free end portion 101b and the first intermediate portion 101c. The ratio of the size of the second base member 201 in the first direction to that in the second direction can be set similarly to the ratio of the size of the first base member 101 described above.

The second base member 201 is provided with a cutting line 205 formed adjacent to the connecting member 300. The cutting line 205 is formed at a location spaced apart in the first direction from the short side of the first connecting end portion 101a. The cutting line 205 is formed adjacent to the first connecting end portion 101a and along the outer edge of the first connecting end portion 101a. In the present embodiment, the cutting line 205 is a perforated line. When using the connected body 1, the first light emitting device 100 and the second light emitting device 200 can be separated by cutting the second base member 201 along the cutting line 205.

A plurality of second light emitting elements 202 are arranged on the second upper surface 201S (see FIG. 2) of the second base member 201. More specifically, the plurality of second light emitting elements 202 are arranged in a line along the first direction on the second intermediate portion 201c of the second base member 201. Also, each of the plurality of second light emitting elements 202 is electrically connected to the second connector 204 via the second base member 201. The plurality of second light emitting elements 202 emit light when supplied with electrical current from an external power source which is connected to the second connector 204.

Each of the plurality of second sealing resin members 203 is arranged on the second upper surface 201S (see FIG. 2) of the second base member 201 to seal corresponding one of the plurality of second light emitting elements 202. Therefore, the plurality of second sealing resin members 203 are arranged in a line along the first direction on the second intermediate portion 201c of the second base member 201. In the present embodiment, each of the second sealing resin members 203 is formed in a hemisphere shape centered at corresponding one of the light emitting elements 30. The material of the second sealing resin members 203 is similar to the material of the first sealing resin members 103 described above.

The second connector 204 is arranged on the second free end portion 201b of the second base member 201. The second connector 204 is electrically connected to the plurality of second light emitting elements 202 via the second base member 201. The second connector 204 can be connected to an external power source and configured to supply electric power from the external power source to the plurality of second light emitting elements 202.

3. Connecting Member 300

The connecting member 300 connects the first connecting end portion 101a of the first base member 101 and the second connecting end portion 201a of the second base member 201. The connecting member 300 is arranged at the opposite side of the first connector 104 with the first base member 101 in between. Accordingly, the position of the connecting member 300 in the first direction overlaps the position of the first connector 104 in the first direction. The connecting member 300 supports the first connector 104 from the backside of the first base member 101.

Also, the connecting member 300 is, as shown in FIG. 2, placed between a first lower surface 101T of the first base member 101 and a second upper surface 201S of the second base member 201. That is, the connecting member 300 is placed between the first connecting end portion 101a and the second connecting end portion 201a. Thus, the position of the connecting member 300 in the first direction overlaps the positions of the first connecting end portion 101a and the second connecting end portion 201a in the first direction.

Such a connecting member 300 can be made by a material which can connect the first connecting end portion 101a and the second connecting end portion 201a with predetermined bonding strength or adhesion strength. Examples of such materials include tacky materials such as a double coated tape as well as adhesives such as an epoxy-based adhesive, a polyurethane-based adhesive, and a two-part acrylic based adhesive. The connecting member 300 may be formed with a pressure-sensitive tacky material which can be used without heating. The connecting member 300 is preferably constituted with a material which has elasticity.

The connecting member 300 preferably has a thickness of about 10 μm to about 100 μm. This is because, with such a thickness, occurrence of hitch or catch during winding operation for packing due to differences in the thickness of the connected body 1 can be avoided.

Configuration of First Base Member 101 and Second Base Member 201

Next, the configurations of the first base member 101 and the second base member 201 will be described with reference to the drawings. The first base member 101 and the second base member 201 have similar configurations to each other, so that the configuration of the first base member 101 will be described below.

Figure 3:
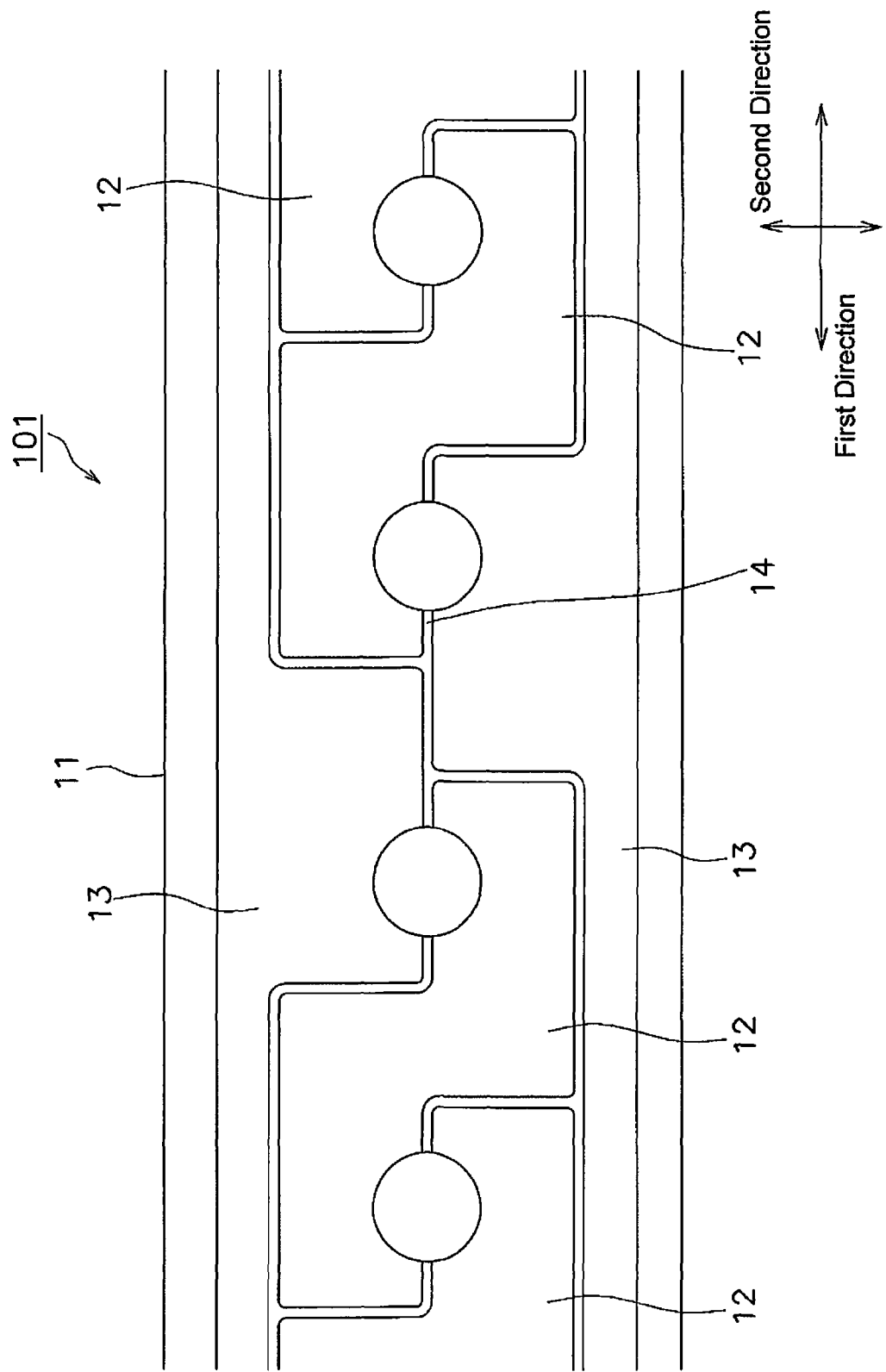
FIG. 3 is a partially enlarged view of FIG. 1.
Figure 4:
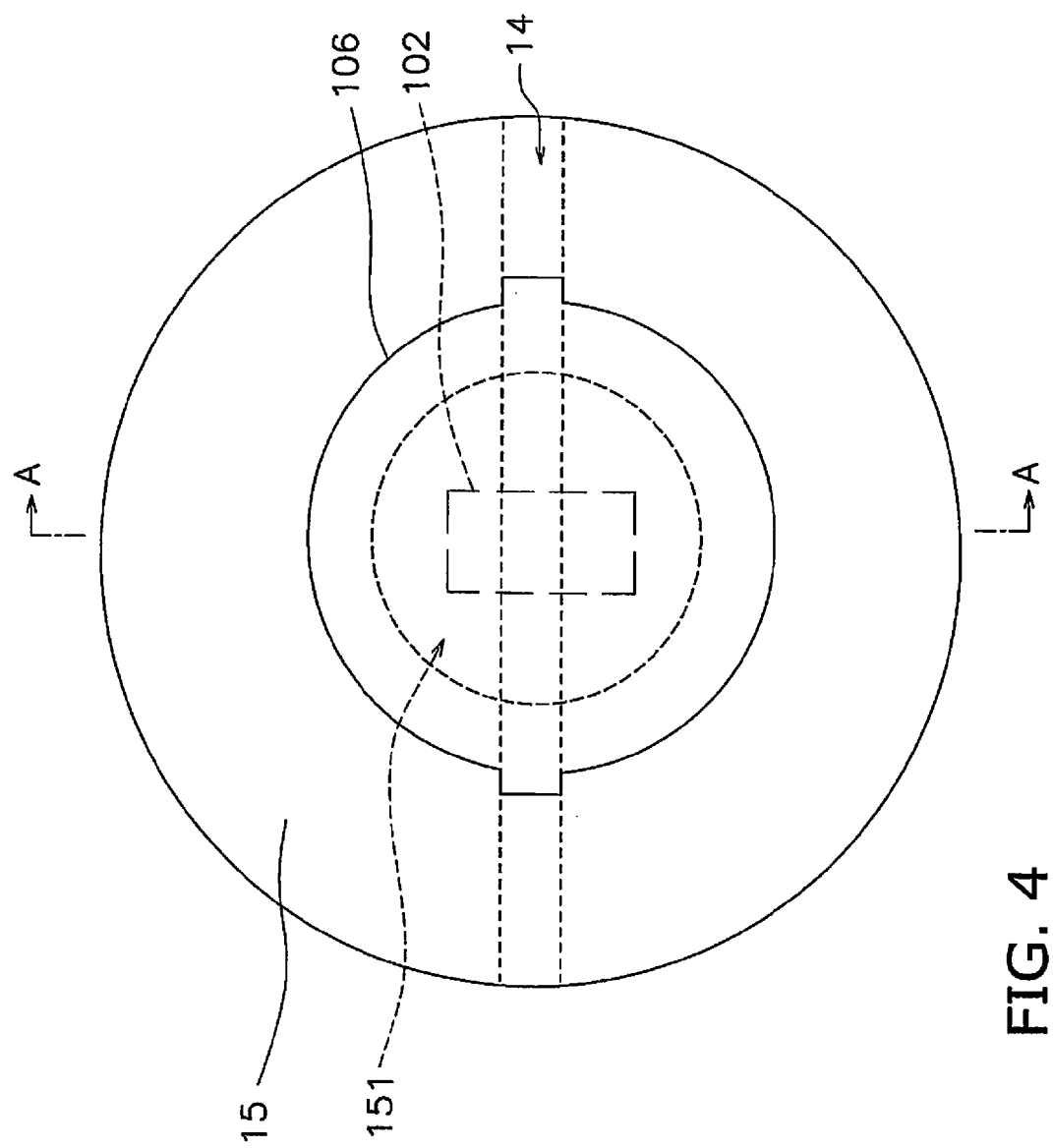
FIG. 4 is a partially enlarged view of FIG. 3.

FIG. 3 shows a partially enlarged view of FIG. 1. FIG. 4 shows a partially enlarged view of FIG. 3. In FIG. 4, the sealing resin member 103 is omitted to illustrate the inner structure. As shown in FIG. 3 and FIG. 4, the first base member 101 includes a substrate 11, a plurality of wiring portions 12, a pair of terminal portions 13, a groove portion 14, and a reflecting layer 15. In FIG. 3, the reflecting layer 15 is not shown.

The substrate 11 can be made of a flexible insulating material. For such a material, an insulating resin such as a polyethylene terephthalate resin, a polyimide resin, or the like can be preferably used but is not limited thereto. For example, the substrate 11 may be made of a strip of copper foil or aluminum foil which is covered with an insulating resin. The substrate 11 may have a thickness of about 10 μm to about 100 μm. The material of the substrate 11 can be appropriately selected in view of the type of mounting of the light emitting elements 30, the reflectance, and adhesion with other members, etc. As for the material of the substrate 11, for example, in the case where a solder is used for mounting the light emitting elements 30, a polyimide which has a high heat resisting property is preferably used, and in the case where the reflecting layer 15 to be described below is not provided on the substrate 11, a material which has a high optical reflectance (for example a white color material) is preferably used.

The plurality of wiring portions 12 are arranged on a main surface of the substrate 11. The plurality of wiring portions 12 can be made of a thin metal film such as a copper foil or an aluminum foil, for example. As shown in FIG. 3, the plurality of wiring portions 12 are arranged in a zigzag manner along the first direction. The plurality of wiring portions 12 are also arranged spaced apart from one another in the first direction. The plurality of wiring portions 12 are also arranged spaced apart from the pair of terminal portions 13. The plurality of wiring portions 12 are covered with the reflecting layer 15. But as described below, a part of the plurality of wiring portions 12 are exposed from the reflecting layer 15 in the openings 151 formed in the reflecting layer 15. Each of the plurality of wiring portions 12 is connected to the corresponding first light emitting element in the region exposed from the reflecting layer 15 in each opening 151. The configuration of the first light emitting elements 102 will be described below.

Each of the plurality of wiring portions 12 has a thickness which does not impair the flexibility of the substrate 11, which can be 8 μm to 150 μm. The plurality of wiring portions 12 are preferably formed with a wide area to improve heat dissipation. Also, in order to apply equal amount of heat on each wiring portions 12 at the time of heating in a reflow step or the like when mounting the light emitting elements, it is preferable that a pair of wiring portions 12 to which one light emitting element to be connected have equal surface areas (or volume).

The pair of terminal portions 13 are arranged on a main surface of the substrate 11. The pair of terminal portions 13 are extended in the first direction on both sides of the plurality of wiring portions 12 and connected to the connector 104.

The groove portion 14 is a portion on the main surface of the substrate 11 where the plurality of wiring portions 12 and the pair of terminal portions 13 are not arranged. That is, the groove portion 14 is formed between the plurality of wiring portions 12 and between the wiring portions 12 and their corresponding terminal portions 13. The interval between the groove portions 14 can be, for example, about 0.05 mm to about 5 mm. The material and thickness of the end portion 13 may be similar to that of the wiring portion 12.

The reflecting layer 15 covers the substrate 11, the plurality of wiring portions 12 and the pair of terminal portions 13. The reflecting layer 15 also enters into the groove portion 14. The reflecting layer 15 is made of a material which can reflect light emitted from the light emitting elements 102. For such a material, an insulating white ink which is a so-called "white resist" made of a silicone resin containing titanium oxide can be preferably used. The reflective layer 15 includes the openings 151, one of which is shown in FIG. 4. The openings 151 are arranged so that the light emitting elements 102 are connected to the pair of wiring portions 12, or the light emitting elements 102 are connected to a wiring portion 12 and a terminal portion 13, respectively. Each opening 151 is, as shown in FIG. 4, covered with an underfill material 106 which will be described below.

Configuration of First Light Emitting Element 102 and Second Light Emitting Element 202

The configurations of the first light emitting elements 102 and the second light emitting elements 202 will be described below with reference to the drawings. The first light emitting elements 102 and the second light emitting elements 202 have similar configurations to each other, so that the configuration of the first light emitting elements 102 will be described below.

Figure 5:
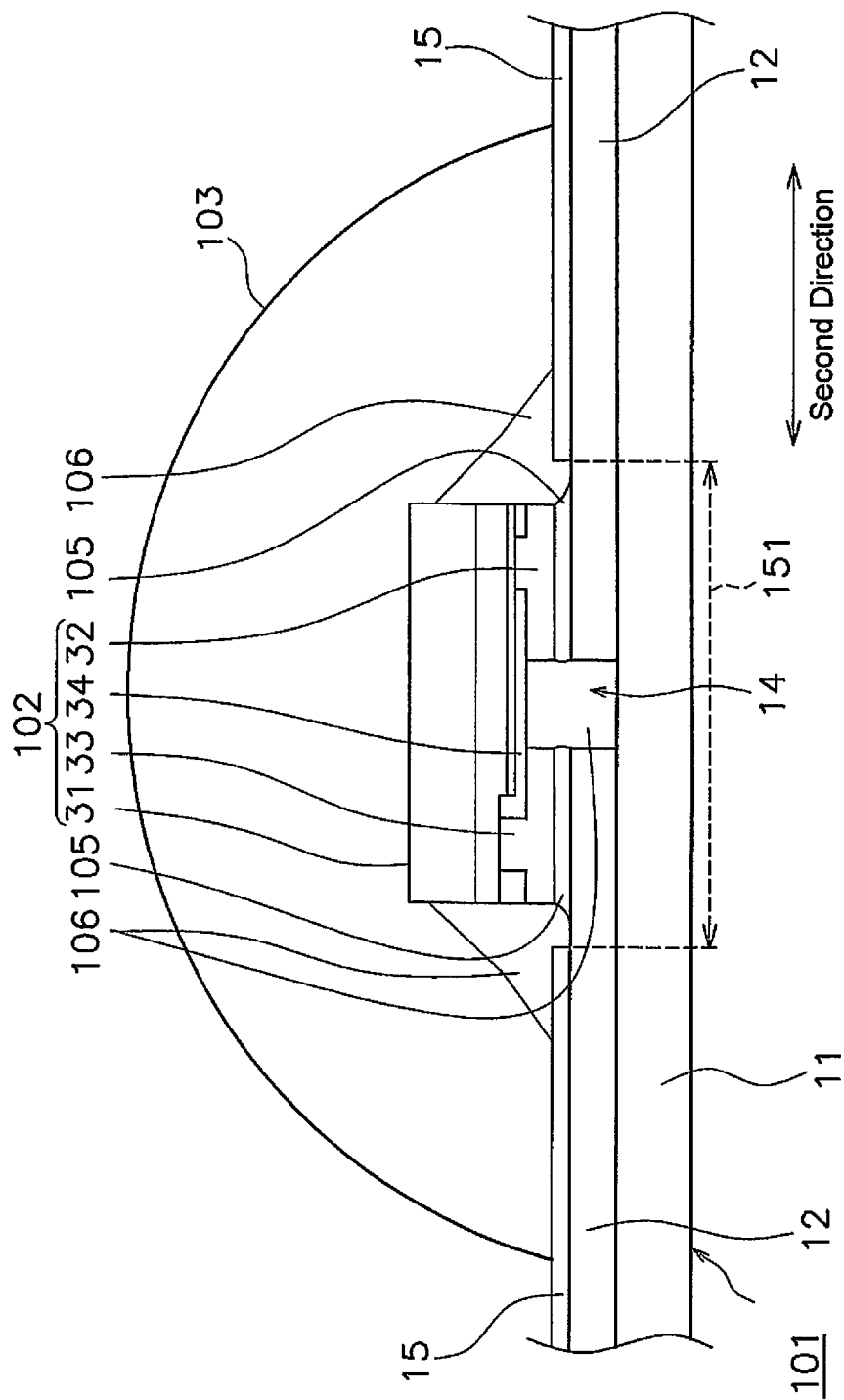
FIG. 5 is a cross sectional view taken along a line A-A of FIG. 4.

FIG. 5 is a cross sectional view taken along line A-A of FIG. 4. As shown in FIG. 5, the light emitting element 102 is mounted in a flip chip manner in the opening 151 of the reflecting layer 15. The first light emitting element 102 is connected to a pair of sections of the wiring portion 12 via a pair of bonding members 105 respectively. The bonding member 105 can be made of, for example, a solder such as Sn—Ag—Cu system, Au—Sn system, or a Sn—Cu system, a metal such as Au, an anisotropic conductive paste, or an Ag paste. An underfill material 106 can be filled between the light emitting element 102 and the first base member 101. The underfill material 106 can be made of, for example, a silicone resin or an epoxy resin, a fluororesin, or a hybrid resin containing one or more those resins. The underfill material 106 preferably has a light reflecting property which can be obtained by containing titanium oxide, silicon oxide, or alumina, which has a white color.

Each of the light emitting elements 102 can include, as shown in FIG. 5, a semiconductor structure 31, a p-side electrode 32, an n-side electrode 33, and an insulating material layer 24. The semiconductor structure 31 includes an n-type layer, an active layer, and a p-type layer which are stacked in the order on a light-transmissive sapphire substrate. The n-type layer, the active layer and the p-type layers can be respectively made of, for example, a gallium nitride-based semiconductor. The p-side electrode 32 and the n-side electrode 33 are connected to a pair of the wiring portions 12 via a pair of bonding members 105, respectively. The n-side electrode 33 is extended to a lower portion of the p-type layer via the insulating material layer 34.

For the first light emitting element 102, a light emitting diode formed by packaging an LED chip as well as so-called LED-chips as described above can be used. In this case, the first sealing resin member 103 can be provided on the light emitting diode, or a packaged light emitting diode can be further covered with the first sealing resin member 103.

Performance and Effects (1) The connected body 1 according to the first embodiment includes the first light emitting device 100, the second light emitting device 200, and the connecting member 300. The first light emitting device 100 includes the first base member 101 which includes the first connecting end portion 101a, and the first connector 104 arranged on the first connecting end portion 101a. The second light emitting device 200 includes the second base member 201 which includes the second connecting end portion 201a. The connecting member 300 connects the first connecting end portion 101a and the second connecting end portion 201a. The position of the connecting member 300 in the first direction overlaps the position of the first connector 104 in the first direction.

Thus, the first connecting end portion 101a can be reinforced by the connecting member 300 so as not to be damaged. Accordingly, at the time of winding around a spool or when separating the first light emitting device 100 from the second light emitting device 200 to use, the first connector 104 which serves as an electronic component can be prevented from being damaged.

The connecting member 300 is for connecting the first connecting end portion 101a and the second connecting portion 201a, so that, for example, compared to a technique such as entirely wrapping the first light emitting device 100 and the second light emitting device 200 with a film, the packaging can be performed easily while suppressing material cost.

(2) The connecting member 300 is interposed between the first connecting end portion 101a and the second connecting end portion 201a.

Thus, the first connector 104 can be supported more firmly not only by the connecting member 300 but also by the second connecting end portion 201a.

(3) The second base member 201 of the second light emitting device 200 is provided with the cutting line 205 formed adjacent to the connecting member 300.

Thus, when separating the first light emitting device 100 from the second light emitting device 200 for use, a user can easily recognize the location of cutting the second light emitting device 200 which is an electronic device.

(4) The cutting line 205 is a perforated line.

Accordingly, the first light emitting device 100 can be easily separated from the second light emitting device 200 without using an iron tool or the like.

(5) In the first light emitting device 100 separated from the second light emitting device 200, the connecting member 300 and the second connecting end portion 201a, which are remaining under the first connector 104, reinforces the first connector 104 in the use.

Second Embodiment

A configuration of a connected body 1A according to a second embodiment will be described below with reference to the drawings. The connected body 1A according to the second embodiment differs from the connected body 1 according to the second embodiment in that, the first light emitting device 100 and the second light emitting element 200 are not overlapped. Now, mainly the differences will be described below. The same reference numerals will be applied to the members which are similar to those in the first embodiment and descriptions thereof will be appropriately omitted.

Configuration of Connected Body 1A

Figure 6:
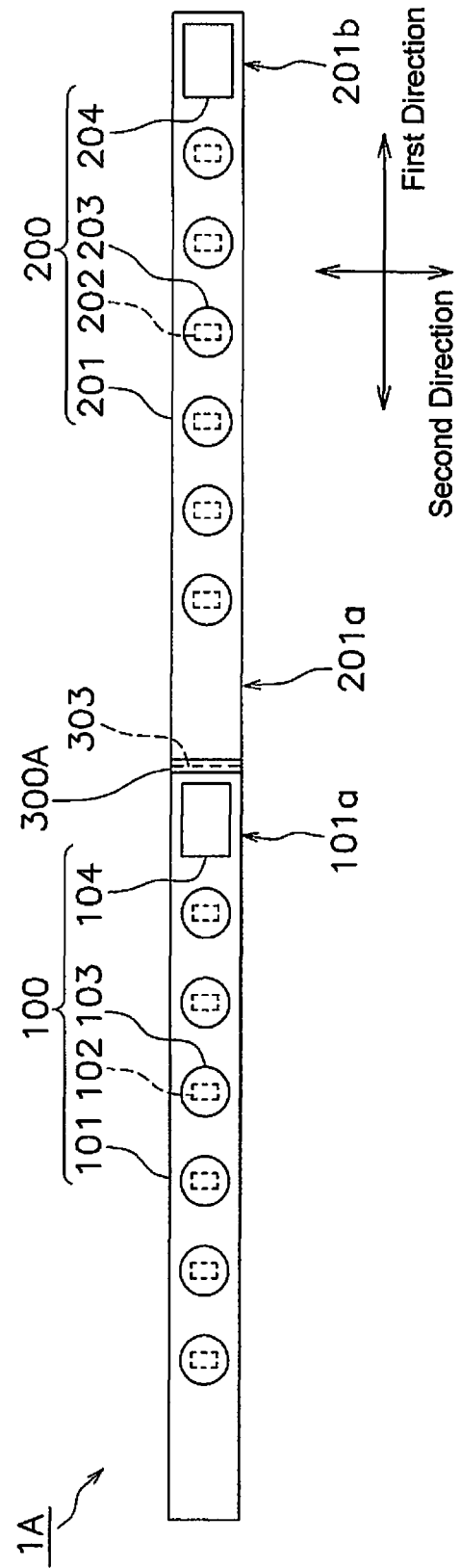
FIG. 6 is a top view showing a configuration of a connected body according to a second embodiment.
Figure 7:
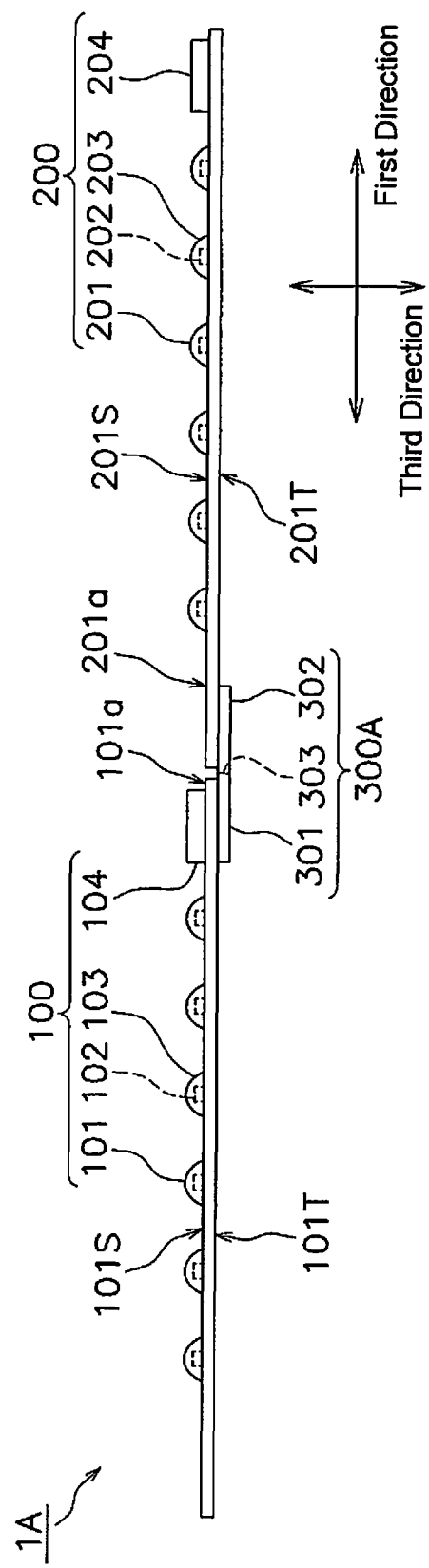
FIG. 7 is a side view showing a configuration of a connected body according to the second embodiment.

FIG. 6 is a top view showing a configuration of a connected body 1A. FIG. 7 is a side view showing a configuration of the connected body 1A.

The connected body 1A includes a first light emitting device 100, a second light emitting device 200, and a connecting member 300A. The connected body 1 is constituted with connecting the first light emitting device 100 and the second light emitting device 200 by the connecting member 300A. In the present embodiment, the first connecting end portion 101a of the first light emitting device 100 and the second connecting end portion 201a of the second light emitting device 200 are spaced apart from each other in the first direction.

The connecting member 300A connects the first connecting end portion 101a and the second connecting end portion 201a. The connecting member 300A is arranged at the opposite side of the first connector 104 with the first base member 101 in between. Accordingly, the position of the connecting member 300A in the first direction overlaps the position of the first connector 104 in the first direction. The connecting member 300A supports the first connector 104 from the backside of the first base member 101.

The connecting member 300A includes a first portion 301, a second portion 302, and a cutting line 303. The first portion 301 is adhered to the first lower surface 101T of the first base member 101. The second portion 302 is adhered to the second lower surface 201T of the second base member 201. The position of the first connecting member 301 in the first direction overlaps the position of the first connecting end portion 101a in the first direction. The position of the second portion 302 in the first direction overlaps the position of the second connecting end portion 201a in the first direction. The cutting line 303 is formed between the first connecting end portion 101a and the second connecting end portion 201a. That is, the cutting line 303 is formed on the boundary between the first portion 301 and the second portion 302. The cutting line 303 is formed along the second direction. As shown in FIG. 6 and FIG. 7, the cutting line 303 is exposed from the gap between the first connecting end portion 101a and the second connecting end portion 201a. In the present embodiment, the connecting member 300A is, for example, a single-sided adhesive tape and the cutting line 303 is a perforated line.

The connecting member 300A can be made of the similar materials as the connecting member 300 according to the first embodiment.

Performance and Effects (1) The connected body 1A includes the first light emitting device 100, the second light emitting device 200, and the connecting member 300A. The position of the connecting member 300A in the first direction overlaps the position of the first connector 104 in the first direction.

Accordingly, the first connector 104 can be supported by the connecting member 300A, so that the first connector 104 can be prevented from detaching from the first base member 101.

(2) The first connecting end portion 101a and the second connecting end portion 201a are spaced apart from each other in the first direction.

Accordingly, an increase in the thickness of the connected body 1A can be suppressed compared to the case where the first connecting end portion 101a and the second connecting end portion 201a overlap. Accordingly, at the time of winding around a spool or when separating the first light emitting device 100 from the second light emitting device 200 to use, the first connector 104 can be prevented from protruding to the first upper surface 101S side.

(3) The connecting member 300A is provided with the cutting line 303 formed between the first connecting end portion 101a and the second connecting end portion 201a. The cutting line 303 is exposed from the gap between the first connecting end portion 101a and the second connecting end portion 201a.

Accordingly, when separating the first light emitting device 100 from the second light emitting device 200 to use, a user can easily confirm the location to cut.

(4) The cutting line 303 is a perforated line.

Accordingly, the first light emitting device 100 can be easily separated from the second light emitting device 200 without using an iron tool or the like.

(5) The separated first light emitting device 100 has the connecting member 300A below the first connector 104 which can reinforce the connector in the use.

Third Embodiment

Next, a configuration of a connected body 1B according to a third embodiment will be described with reference to the drawings. The connected body 1B according to the third embodiment differs from the connected body 1 according to the first embodiment in that, the plurality of first sealing resin members 103 and the first connector 104 are protected by a connecting member. In the below, mainly the differences will be described, and the same reference numerals will be applied to the members which are similar to those in the first embodiment and descriptions thereof will be appropriately omitted.

Configuration of Connected Body 1B

Figure 8:
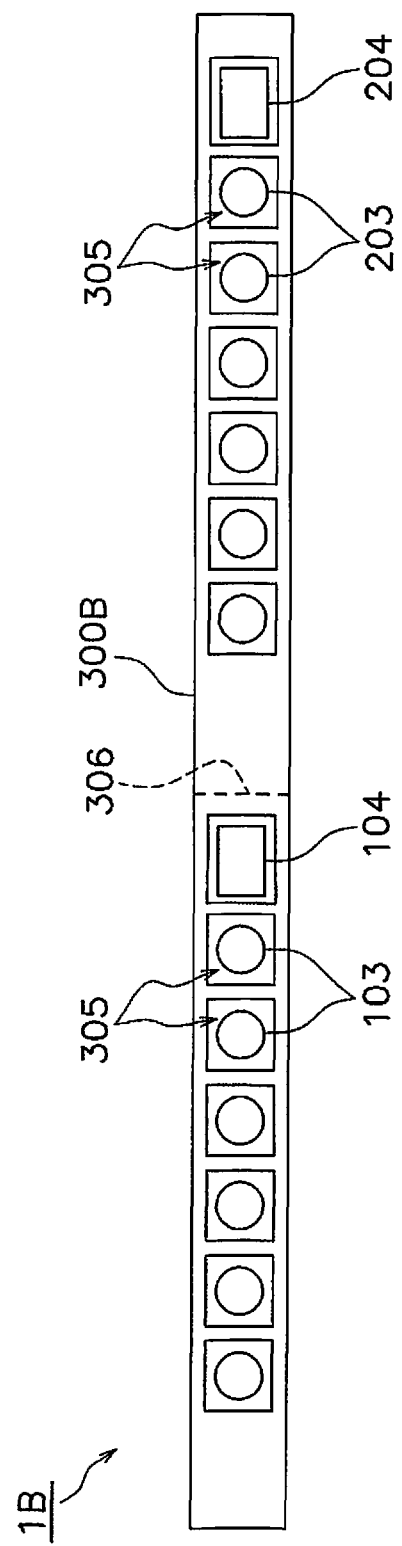
FIG. 8 is a top view showing a configuration of a connected body according to a third embodiment.
Figure 9:
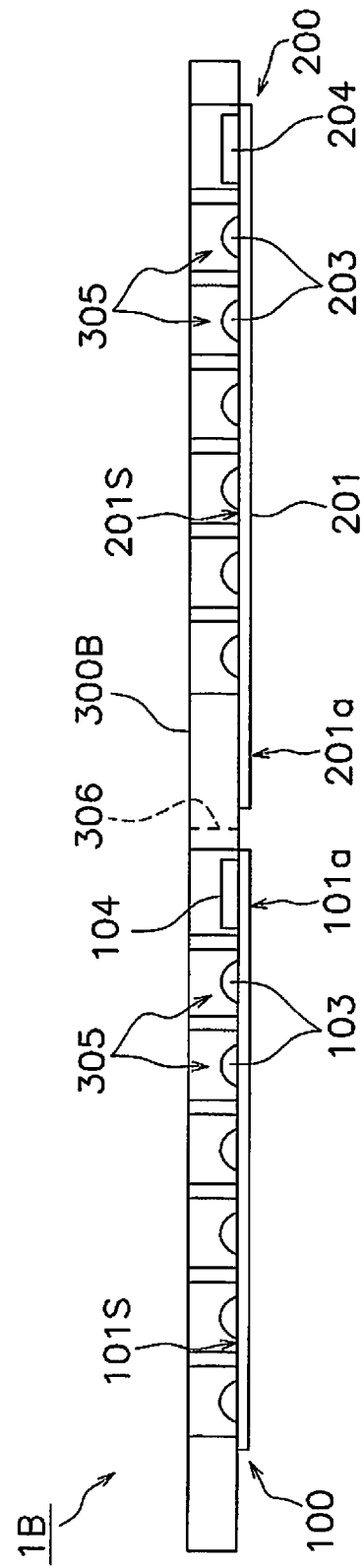
FIG. 9 is a cross-sectional view showing a configuration of a connected body according to the third embodiment.

FIG. 8 is a top view showing a configuration of a connected body 1B. FIG. 9 is a cross-sectional view showing a configuration of a connected body 1B.

The connected body 1B includes a first light emitting device 100, a second light emitting device 200, and a connecting member 300B. The connected body 1 is constituted with connecting the first light emitting device 100 and the second light emitting device 200 by the connecting member 300B. In the present embodiment, the first connecting end portion 101a of the first light emitting device 100 and the second connecting end portion 201a of the second light emitting device 200 are spaced apart from each other in the first direction.

The connecting member 300B connects the whole of the first light emitting device 100 and the whole of the second light emitting device 200. More specifically, the connecting member 300B is pasted to the whole surface of the first upper surface 101S of the first base member 101 and also pasted to the whole surface of the second upper surface 201S of the second base member 201. Accordingly, the position of the connecting member 300B in the first direction overlaps the position of the first connector 104 in the first direction. The connecting member 300B supports the first connector 104 from the front side of the first base member 101. It is preferable that the connecting member 300B is pasted with adhesive strength or bonding strength which allows removal of the connecting member 300B when using the first light emitting device 100 and/or the second light emitting device 200.

The connecting member 300B defines a plurality of housing holes 305 to respectively accommodate each of a plurality of first sealing resin members 103 and the first connector 104. The connecting member 300B surrounds each of the plurality of first sealing resin members 103 and the first connector 104. Meanwhile, in top view, the plurality of sealing resin members 103 and the connector 104 are exposed in the plurality of housing holes 305 respectively.

The connecting member 300B preferably serves as a buffer material. In this case, the thickness of the connecting member 300B is, as shown in FIG. 9, preferably greater than the heights of the plurality of first sealing resin members 103 and the first connector 104. Such a connecting member 300B can be constituted with an elastic or flexible porous material such as a urethane material or a paper material. The connecting member 300B is preferably softer than the plurality of first sealing resin members 103. With this, even when the connecting member is deformed and brought in contact with the plurality of first sealing resin members 103, stress can be avoided from being applied to the first sealing resin members 103.

The connecting member 300B is provided with a cutting line 306. The cutting line 306 is formed between the first connecting end portion 101a and the second connecting end portion 201a. The cutting line 306 is formed along the second direction. As shown in FIG. 9, the cutting line 306 is exposed from the gap between the first connecting end portion 101a and the second connecting end portion 201a. In the present embodiment, the cutting line 306 is a perforated line.

Performance and Effects (1) The connected body 1B according to the third embodiment includes a first light emitting device 100, a second light emitting device 200, and a connecting member 300B. The position of the connecting member 300B in the first direction overlaps the position of the first connector 104 in the first direction.

Accordingly, the first connector 104 can be supported by the connecting member 300B, so that the first connector 104 can be prevented from detaching from the first base member 101.

(2) The connecting member 300B surrounds outer periphery of each of the plurality of first sealing resin members 103 and the first connector 104.

Accordingly, the plurality of first sealing resin members 103 and the first connector 104 can be prevented from being damaged at the time of packaging. Also, when using the first light emitting device 100, the first light emitting device 100 can be adhered to a heat sink or the like by pressing the entire connecting member 300B. Thus, stress is not applied on the plurality of first sealing resin members 103 and the first connector 104, so that damage of the plurality of first sealing resin members 103 and the first connector 104 can be prevented.

(3) The connecting member 300B is provided with a cutting line 306 formed in the first direction and between the first connecting end portion 101a and the second connecting end portion 201a. The cutting line 306 is exposed from the gap between the first connecting end portion 101a and the second connecting end portion 201a.

Accordingly, when separating the first light emitting device 100 from the second light emitting device 200 to use, a user can easily confirm the location to cut.

(4) The cutting line 306 is a perforated line.

Accordingly, the first light emitting device 100 can be easily separated from the second light emitting device 200 without using an iron tool or the like.

Other Embodiments

The present invention is described with the embodiments shown above. It should be understood, however, that the description and the drawings, which are parts of the description, are intended as illustrative of the present invention, and the scope of the present invention is not limited to those. Various alternate embodiments, examples, and operational technologies will become apparent to one skilled in the art, from the description provided herein.

(A) In the embodiment described above, the first light emitting device 100 and the second light emitting device 200 have a first direction of its longitudinal direction, but is not limited thereto. The first direction is a winding direction of the connected body 1 and the sizes of the first light emitting device 100 and the second light emitting devices 200 can be changed appropriately. Accordingly, the first light emitting device 100 and the second light emitting device 200 may be rectangular members extending in the second direction, or may be square members.

(B) In the embodiment described above, the first light emitting device 100 includes the first connector 104 as an example of its electric components, but is not limited thereto. The first light emitting device 100 may include, for example, various diodes, as its electronic components.

(C) In the embodiment described above, the first light emitting elements 102 are mounted in a flip-chip manner, but are not limited thereto. The first light emitting elements 102 may be mounted using die-bonding or wire bonding methods.

(D) In the embodiments described above, the configurations of the connecting members 300, 300A, 300B are described, but the configuration of the connecting member is not limited to those.

Figure 10:
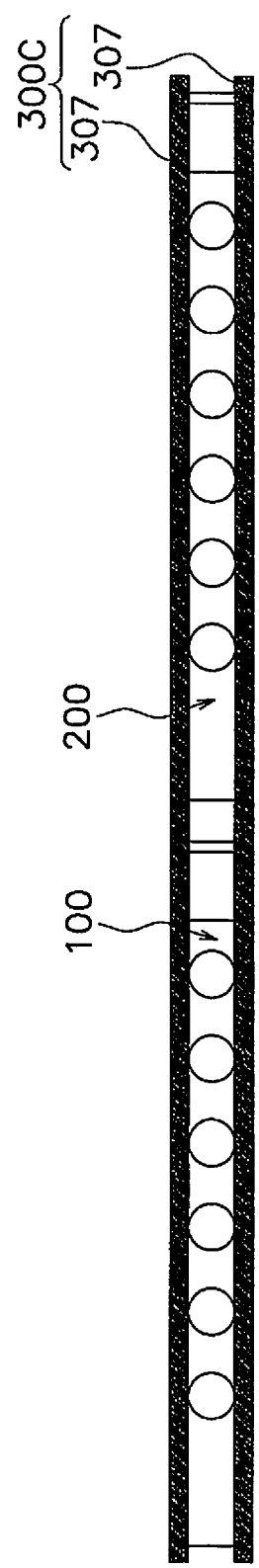
FIG. 10 is a top view showing a configuration of a connected body according to another embodiment.

For example, as in the connecting member 300C shown in FIG. 10, the connecting member may be made with two rod-shaped members 307 which connect the first light emitting device 100 and the second light emitting device 200. The two rod-shaped members 307 are arranged along the first direction. The two rod-shaped members 307 are arranged at the both sides, in the second direction, of the plurality of sealing resin members 103, the first connector 104, the plurality of second sealing resin members 203, and the second connector 204. The first connector 104 can be supported by the connecting member 300A as described above, so that the first connector 104 can be prevented from detaching from the first base member 101.

Figure 11:
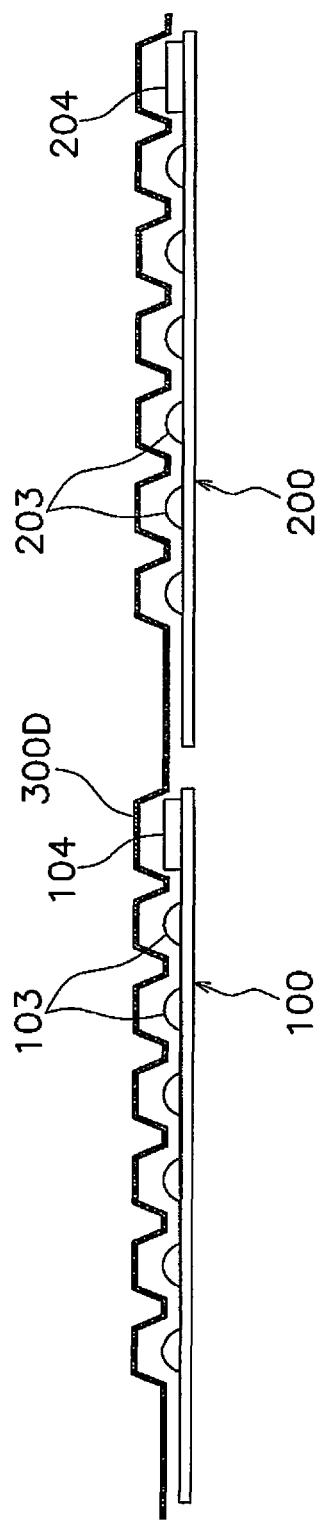
FIG. 11 is a side view showing a configuration of a connected body according to another embodiment.

Also, as shown in FIG. 11, a connecting member 300D which connects the whole of the first light emitting device 100 and the second light emitting device 200 may be used. The connecting member 300D is constituted with a flexible film member. The connecting member 300D cover the plurality of first sealing resin members 103, the first connector 104, the plurality of second sealing resin members 203, and the second connector 204.

(E) In the third embodiment described above, in top view, the plurality of first sealing resin members 103 and the first connector 104 are exposed in the plurality of housing holes 305 respectively, but the configuration is not limited thereto. The plurality of housing holes 305 may be covered with a covering film made of paper or a resin. Also, the holes may not be provided.

(F) In the first embodiment described above, the connecting member 300 is arranged opposite to the first connector 104 with the first connecting end portion 101*a* in between, but the configuration is not limited thereto. The connecting member 300 may not disposed opposite to the first connector 104 with the first connecting end portion 101*a* in between. That is, as long as the positions of the connecting member 300 and the first connector 104 in the first direction overlap, the positions of the connecting member 300 and the first connector 104 in the second direction can be different.

As described above, it should be obvious that various other embodiments are possible without departing the spirit and scope of the present invention. Accordingly, the scope and spirit of the present invention should be limited only by the following claims.

According to the illustrated embodiment, a connected body of a plurality of light emitting devices which allows easy packaging can be provided, and can be advantageously applied in the fields of, such as liquid crystal displays, TV-screens, and lighting applications.

What is claimed is:

1. A connected body of a plurality of light emitting devices comprising:
    a first light emitting device including
        a flexible first substrate member extending in a predetermined direction,
        a first light emitting element arranged on the first substrate member, and
        an electronic component arranged on a first end portion of the first substrate member with respect to the predetermined direction;
    a second light emitting device including
        a flexible second substrate member extending in the predetermined direction, and
        a second light emitting element arranged on the second substrate member;
    a connecting member connecting the first end portion of the first substrate member and a second end portion of the second substrate member adjacent to the first end portion of the first substrate member, the connecting member being connected to an upper surface of the first end portion of the first substrate member and connected to an upper surface of the second end portion of the second substrate member,
    wherein a position of at least a part of the connecting member in the predetermined direction overlaps a position of the electronic component in the predetermined direction, with the connecting member being spaced apart from the electronic component, and
    the first end portion of the first substrate member and the second end portion of the second substrate member are spaced apart from each other in the predetermined direction.

2. The connected body of a plurality of light emitting devices according to claim 1, wherein
    the second substrate member includes a cutting line formed adjacent to the first end portion in the predetermined direction and along an outer edge of the first end portion.

3. The connected body of a plurality of light emitting devices according to claim 2, wherein
    the cutting line is a perforated line.

4. The connected body of a plurality of light emitting devices according to claim 1, wherein
    the connecting member includes a cutting line formed between the first end portion of the first substrate member and the second end portion of the second substrate member in the predetermined direction and exposed from a gap between the first end portion and the second end portion.

5. The connected body of a plurality of light emitting devices according to claim 4, wherein
    the cutting line is a perforated line.

6. The connected body of a plurality of light emitting devices according to claim 1, wherein
    the connecting member surrounds an outer periphery of the electronic component.

7. The connected body of a plurality of light emitting devices according to claim 1, wherein
    the connecting member covers the first light emitting element, the electronic component, and the second light emitting element.

8. The connected body of a plurality of light emitting devices according to claim 1, wherein
    the electronic component is electrically connected to the first light emitting element.

9. The connected body of a plurality of light emitting devices according to claim 1, wherein
    the connecting member at least partially overlaps the electronic component with respect to a direction perpendicular to the predetermined direction.

* * * * *

(12) EX PARTE REEXAMINATION CERTIFICATE (191st)
Ex Parte Reexamination Ordered under 35 U.S.C. 257

United States Patent
Tamura et al.

(10) Number: US 9,784,438 C1
(45) Certificate Issued: Feb. 8, 2021

(54) CONNECTED BODY OF A PLURALITY OF LIGHT EMITTING DEVICES

(71) Applicant: NICHIA CORPORATION, Anan (JP)

(72) Inventors: Takeshi Tamura, Anan (JP); Tomonori Ozaki, Anan (JP); Yasuo Fujikawa, Tokushima (JP)

(73) Assignee: NICHIA CORPORATION

Supplemental Examination Request:
No. 96/000,328, Jun. 19, 2020

Reexamination Certificate for:
Patent No.: 9,784,438
Issued: Oct. 10, 2017
Appl. No.: 14/431,448
PCT Filed: Sep. 18, 2013
PCT No.: PCT/JP2013/075126
§ 371 (c)(1),
(2) Date: Mar. 26, 2015
PCT Pub. No.: WO2014/050655
PCT Pub. Date: Apr. 3, 2014

(30) Foreign Application Priority Data

Sep. 28, 2012 (JP) .................. 2012-216945

(51) Int. Cl.
*F21V 23/06* (2006.01)
*F21V 21/005* (2006.01)
*F21S 4/20* (2016.01)
*F21S 4/22* (2016.01)
*F21Y 115/10* (2016.01)
*F21Y 103/10* (2016.01)

(52) U.S. Cl.
CPC ................ *F21V 23/06* (2013.01); *F21S 4/20* (2016.01); *F21S 4/22* (2016.01); *F21V 21/005* (2013.01); *F21Y 2103/10* (2016.08); *F21Y 2115/10* (2016.08); *H01L 2224/73204* (2013.01)

(58) Field of Classification Search
None
See application file for complete search history.

(56) References Cited

To view the complete listing of prior art documents cited during the supplemental examination proceeding and the resulting reexamination proceeding for Control Number 96/000,328, please refer to the USPTO's public Patent Application Information Retrieval (PAIR) system under the Display References tab.

*Primary Examiner* — Minh Nguyen

(57) ABSTRACT

A connected body includes first and second light emitting devices and a connecting member. The first light emitting device includes a flexible first substrate member extending in a predetermined direction, a first light emitting element arranged on the first substrate member, and an electronic component arranged on a first end portion of the first substrate member with respect to the predetermined direction. The second light emitting device includes a flexible second substrate member extending in the predetermined direction, and a second light emitting element arranged on the second substrate member. The connecting member connecting the first end portion of the first substrate member and a second end portion of the second substrate member adjacent to the first end portion of the first substrate. A position of at least a part of the connecting member in the predetermined direction overlaps a position of the electronic component in the predetermined direction.

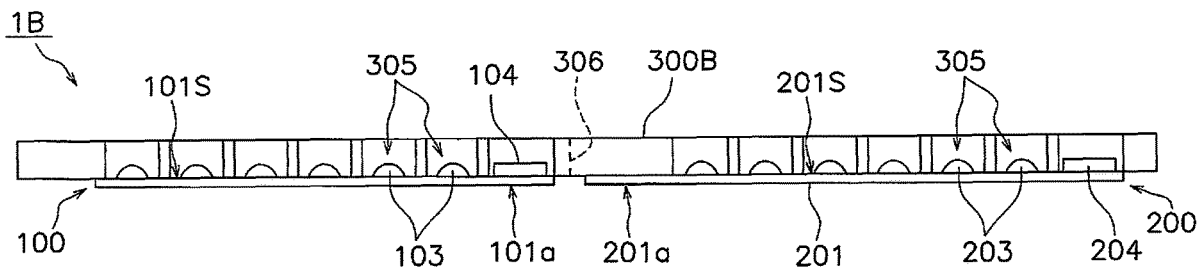

EX PARTE
REEXAMINATION CERTIFICATE

THE PATENT IS HEREBY AMENDED AS
INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 4 and 6-9 are determined to be patentable as amended.

Claims 2-3 and 5, dependent on an amended claim, are determined to be patentable.

New claims 10-17 are added and determined to be patentable.

1. A connected body of a plurality of light emitting devices comprising:
    a first light emitting device including
        a flexible first substrate member extending in a predetermined direction,
        a first light emitting element arranged on the first substrate member, and
        [an electronic component] *a connector configured to be connected to an external power source to supply power to the first light emitting element, the connector being* arranged on a first end portion of the first substrate member with respect to the predetermined direction;
    a second light emitting device including
        a flexible second substrate member extending in the predetermined direction, and
        a second light emitting element arranged on the second substrate member;
    a connecting member connecting the first end portion of the first substrate member and a second end portion of the second substrate member adjacent to the first end portion of the first substrate member, the connecting member being connected to an upper surface of the first end portion of the first substrate member and connected to an upper surface of the second end portion of the second substrate member,
    wherein a position of at least a part of the connecting member in the predetermined direction overlaps a position of the [electronic component] *connector* in the predetermined direction, with the connecting member being spaced apart from the [electronic component] *connector so that the connecting member is not in contact with the connector and so that the connector is exposed from the connecting member in top view*, and
    the first end portion of the first substrate member and the second end portion of the second substrate member are spaced apart from each other in the predetermined direction.

4. [The] *A* connected body of a plurality of light emitting devices [according to claim 1, wherein] *comprising:*
    *a first light emitting device including*
        *a flexible first substrate member extending in a predetermined direction,*
        *a first light emitting element arranged on the first substrate member, and*
        *an electronic component arranged on a first end portion of the first substrate member with respect to the predetermined direction;*
    *a second light emitting device including*
        *a flexible second substrate member extending in the predetermined direction, and*
        *a second light emitting element arranged on the second substrate member;*
    *a connecting member connecting the first end portion of the first substrate member and a second end portion of the second substrate member adjacent to the first end portion of the first substrate member, the connecting member being connected to an upper surface of the first end portion of the first substrate member and connected to an upper surface of the second end portion of the second substrate member,*
    *wherein a position of at least a part of the connecting member in the predetermined direction overlaps a position of the electronic component in the predetermined direction, with the connecting member being spaced apart from the electronic component,*
    *the first end portion of the first substrate member and the second end portion of the second substrate member are spaced apart from each other in the predetermined direction, and*
    the connecting member includes a cutting line formed between the first end portion of the first substrate member and the second end portion of the second substrate member in the predetermined direction and exposed from a gap between the first end portion and the second end portion.

6. The connected body of a plurality of light emitting devices according to claim 1, wherein
    the connecting member surrounds an outer periphery of the [electronic component] *connector*.

7. [The] *A* connected body of a plurality of light emitting devices [according to claim 1, wherein] *comprising:*
    *a first light emitting device including*
        *a flexible first substrate member extending in a predetermined direction,*
        *a first light emitting element arranged on the first substrate member, and*
        *an electronic component arranged on a first end portion of the first substrate member with respect to the predetermined direction;*
    *a second light emitting device including*
        *a flexible second substrate member extending in the predetermined direction, and*
        *a second light emitting element arranged on the second substrate member;*
    *a connecting member connecting the first end portion of the first substrate member and a second end portion of the second substrate member adjacent to the first end portion of the first substrate member, the connecting member being connected to an upper surface of the first end portion of the first substrate member and connected to an upper surface of the second end portion of the second substrate member,*
    *wherein a position of at least a part of the connecting member in the predetermined direction overlaps a position of the electronic component in the predetermined direction, with the connecting member being spaced apart from the electronic component,*
    *the first end portion of the first substrate member and the second end portion of the second substrate member are spaced apart from each other in the predetermined direction, and* the connecting member covers the first light emitting element, the electronic component, and the second light emitting element.

8. The connected body of a plurality of light emitting devices according to claim 1, wherein
the [electronic component] *connector* is electrically connected to the first light emitting element.

9. The connected body of a plurality of light emitting devices according to claim 1, wherein
the connecting member at least partially overlaps the [electronic component] *connector* with respect to a direction perpendicular to the predetermined direction.

10. The connected body of a plurality of light emitting devices according to claim 4, wherein
*the second substrate member includes a cutting line formed adjacent to the first end portion in the predetermined direction and along an outer edge of the first end portion.*

11. The connected body of a plurality of light emitting devices according to claim 4, wherein
the connecting member surrounds an outer periphery of the electronic component.

12. *The connected body of a plurality of light emitting devices according to claim 4, wherein*
*the electronic component is electrically connected to the first light emitting element.*

13. *The connected body of a plurality of light emitting devices according to claim 4, wherein*
*the connecting member at least partially overlaps the electronic component with respect to a direction perpendicular to the predetermined direction.*

14. *The connected body of a plurality of light emitting devices according to claim 7, wherein*
*the second substrate member includes a cutting line formed adjacent to the first end portion in the predetermined direction and along an outer edge of the first end portion.*

15. *The connected body of a plurality of light emitting devices according to claim 7, wherein*
*the connecting member surrounds an outer periphery of the electronic component.*

16. *The connected body of a plurality of light emitting devices according to claim 7, wherein*
*the electronic component is electrically connected to the first light emitting element.*

17. *The connected body of a plurality of light emitting devices according to claim 7, wherein*
*the connecting member at least partially overlaps the electronic component with respect to a direction perpendicular to the predetermined direction.*

\* \* \* \* \*